US007679672B2

(12) United States Patent
Chua et al.

(10) Patent No.: US 7,679,672 B2
(45) Date of Patent: Mar. 16, 2010

(54) ELECTRONIC FLASH, IMAGING DEVICE AND METHOD FOR PRODUCING A FLASH OF LIGHT HAVING A WAVELENGTH SPECTRUM IN THE VISIBLE RANGE AND THE INFRARED RANGE USING A FLUORESCENT MATERIAL

(75) Inventors: Janet Bee Yin Chua, Perak (MY); Kok Chin Pan, Penang (MY); Soo Ghee Lee, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1553 days.

(21) Appl. No.: 10/966,057

(22) Filed: Oct. 14, 2004

(65) Prior Publication Data
US 2006/0082679 A1    Apr. 20, 2006

(51) Int. Cl.
*H04N 5/222*   (2006.01)
*G03B 9/70*    (2006.01)
*G03B 15/02*   (2006.01)
*H01L 29/20*   (2006.01)

(52) U.S. Cl. .................... 348/371; 396/164; 362/11; 257/89

(58) Field of Classification Search .................. 348/99, 348/362, 370, 371, 373; 257/89; 396/155, 396/164, 182; 362/11, 231
See application file for complete search history.

(56) References Cited

U.S. PATENT DOCUMENTS

| | | | |
|---|---|---|---|
| 3,875,456 A | 4/1975 | Kano et al. | |
| 4,866,285 A | 9/1989 | Simms | |
| 4,951,147 A * | 8/1990 | Aknar et al. | 348/143 |
| 6,084,250 A * | 7/2000 | Justel et al. | 257/89 |
| 6,340,824 B1 | 1/2002 | Komoto et al. | |
| 6,351,069 B1 | 2/2002 | Lowery et al. | |
| 6,371,625 B2 | 4/2002 | Campman | |
| 6,515,413 B1 * | 2/2003 | New et al. | 313/493 |
| 6,661,030 B2 | 12/2003 | Komoto et al. | |
| 6,707,997 B2 * | 3/2004 | Hirai et al. | 396/157 |
| 6,927,799 B2 * | 8/2005 | Tseng | 348/371 |
| 7,078,253 B2 | 7/2006 | Brunner et al. | |
| 7,330,577 B2 * | 2/2008 | Ernst et al. | 382/128 |
| 2002/0074559 A1 | 6/2002 | Dowling et al. | |
| 2002/0126078 A1 | 9/2002 | Horibe et al. | |
| 2003/0180037 A1 | 9/2003 | Sommers | |
| 2004/0022531 A1 * | 2/2004 | Schinner | 396/67 |
| 2004/0042774 A1 * | 3/2004 | Takeuchi | 396/61 |
| 2004/0245532 A1 | 12/2004 | Maeda et al. | |

(Continued)

FOREIGN PATENT DOCUMENTS

JP    2000314920    11/2000

(Continued)

*Primary Examiner*—Nhan T Tran
*Assistant Examiner*—Trung Diep

(57) ABSTRACT

An electronic flash, imaging device and method for producing a flash of light having a wavelength spectrum in the visible wavelength range and the infrared wavelength range uses a fluorescent material to convert at least some of the original light emitted from one or more light sources of the electronic flash to longer wavelength light to produce the flash of light. The light sources may be configured to generate light having a peak wavelength in an ultraviolet-and-visible wavelength range. The fluorescent material may include any combination of red, green, blue and yellow phosphors.

23 Claims, 5 Drawing Sheets

U.S. PATENT DOCUMENTS

| | | |
|---|---|---|
| 2004/0263073 A1 | 12/2004 | Baroky et al. |
| 2004/0263074 A1 | 12/2004 | Baroky et al. |
| 2005/0041424 A1 | 2/2005 | Ducharme |
| 2005/0046739 A1* | 3/2005 | Voss et al. ............ 348/371 |
| 2005/0110923 A1 | 5/2005 | Yamashita et al. |
| 2005/0184638 A1 | 8/2005 | Mueller et al. |
| 2005/0224828 A1 | 10/2005 | Oon et al. |

FOREIGN PATENT DOCUMENTS

| | | |
|---|---|---|
| JP | 2001-35210 A * | 12/2001 |
| JP | 2001-352101 | 12/2001 |
| JP | 2004347678 A | 12/2004 |
| KR | 20040033144 A | 4/2004 |
| WO | WO-03/032407 | 4/2003 |

* cited by examiner

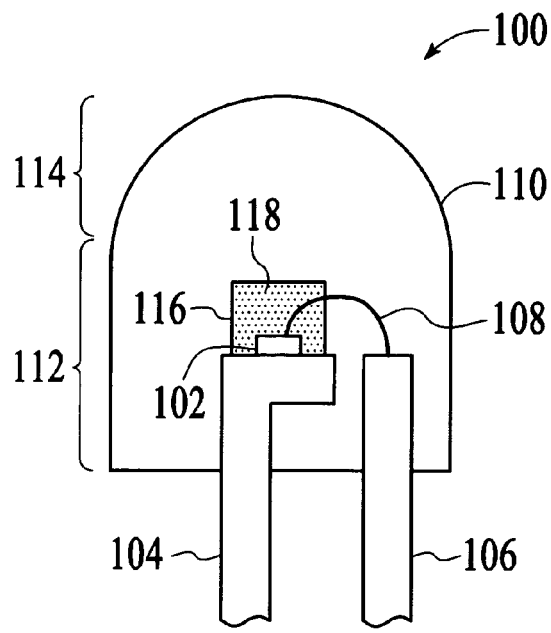
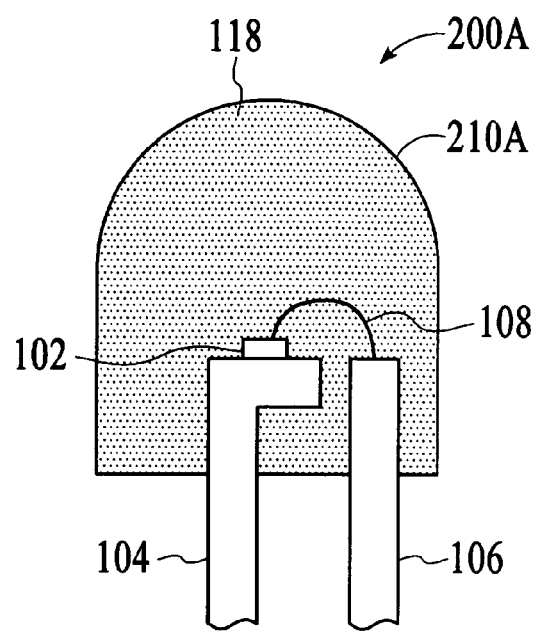
FIG.3  FIG.4A
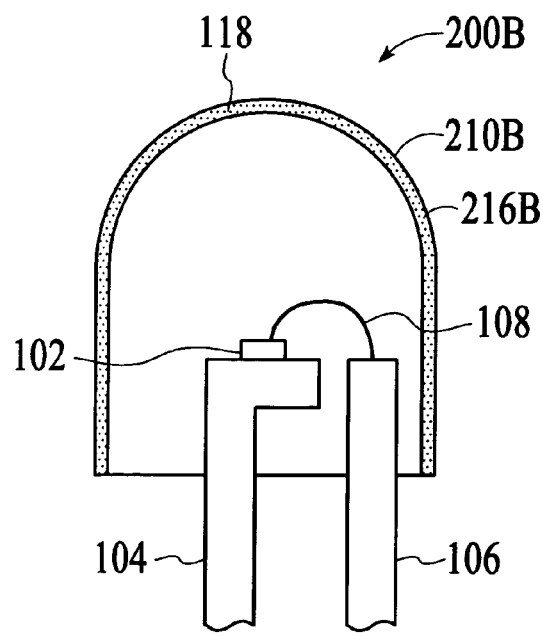
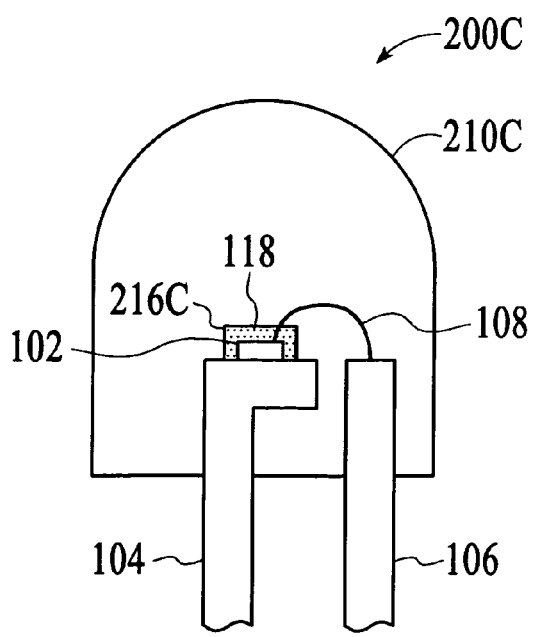
FIG.4B  FIG.4C

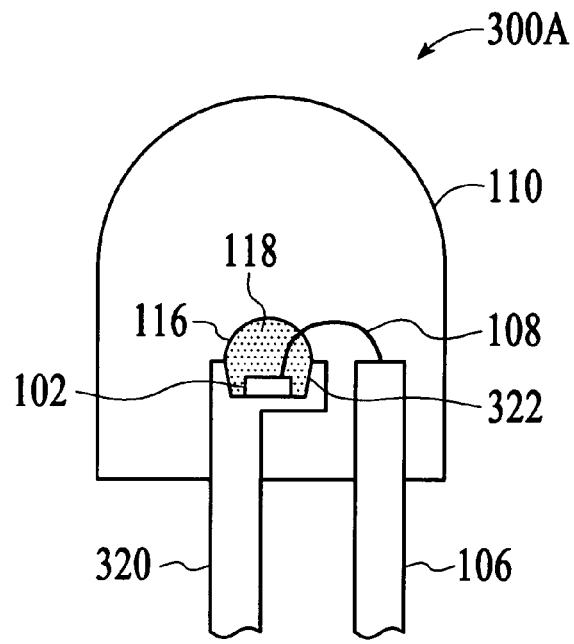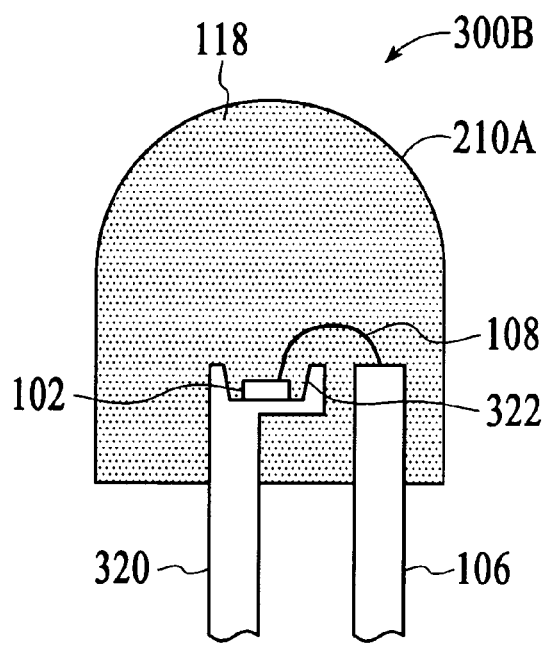
FIG.5A  FIG.5B
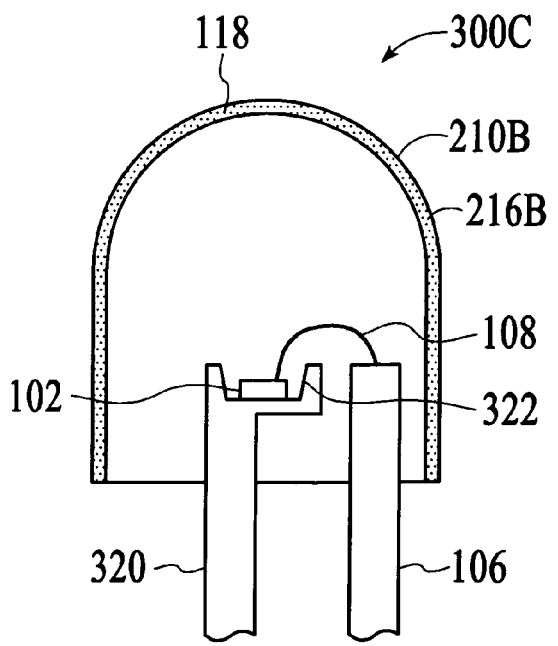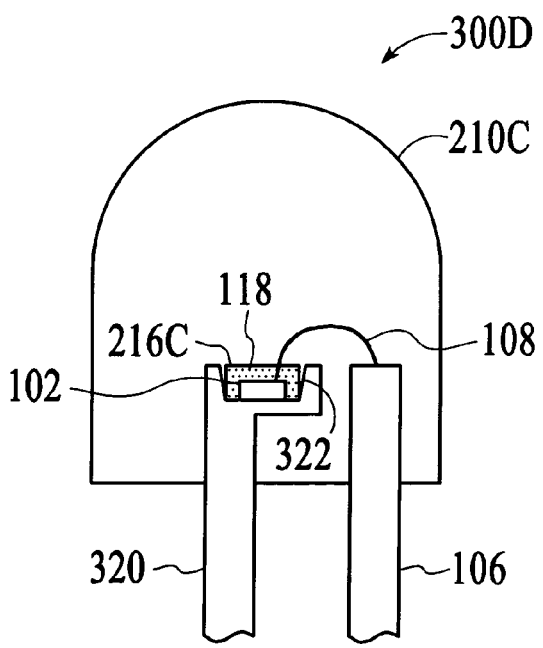
FIG.5C  FIG.5D

ELECTRONIC FLASH, IMAGING DEVICE AND METHOD FOR PRODUCING A FLASH OF LIGHT HAVING A WAVELENGTH SPECTRUM IN THE VISIBLE RANGE AND THE INFRARED RANGE USING A FLUORESCENT MATERIAL

BACKGROUND OF THE INVENTION

Electronic flashes provide supplemental light for photography to enhance images captured by a camera or other imaging devices. Traditional electronic flashes utilize a bulb filled with gas, such as argon, krypton, neon and xenon, or vapor, such as mercury vapor. When a high voltage is applied to the bulb, the gas or vapor is ionized, allowing electrons to flow through the gas or vapor. These electrons excite the atoms of the gas or vapor, which emit light. The wavelength characteristics of the emitted light depends on the gas or vapor in the bulb. In the case of mercury vapor, the emitted light is ultraviolet light, which is usually converted to visible light using fluorescent material since ultraviolet light is typically not desired.

Recently, light emitting diode ("LEDs") have been improved to a point with respect to operating efficiency where LEDs are now replacing conventional light sources, even bulbs in electronic flashes. Existing LEDs can emit light in the ultraviolet ("UV"), visible or infrared ("IR") wavelength range. These LEDs generally have narrow emission spectrum (approximately +/−10 nm). As an example, a blue InGaN LED may generate light with wavelength of 470 nm+/−10 nm. As another example, a green InGaN LED may generate light with wavelength of 510 nm+/−10 nm. As another example, a red AlInGaP LED may generate light with wavelength of 630 nm+/−10 nm. However, since electronic flashes typically need to produce white light for color rendering purposes, different color LEDs such as red, blue and green LEDs are used together in an electronic flash to produce white light. Alternatively, a fluorescent material is introduced into one or more UV, blue or green LEDs in an electronic flash to produce with light using fluorescence.

For different photographic applications, different wavelength characteristics are desired from the supplemental light provided by the electronic flash. Thus, there is a need for an electronic flash, imaging device and method for producing a flash of light in which the color characteristics of the light can be adjusted.

SUMMARY OF THE INVENTION

An electronic flash, imaging device and method for producing a flash of light having a wavelength spectrum in the visible wavelength range and the infrared wavelength range uses a fluorescent material to convert at least some of the original light emitted from one or more light sources of the electronic flash to longer wavelength light to produce the flash of light. The light sources may be configured to generate light having a peak wavelength in an ultraviolet-and-visible wavelength range. The fluorescent material may include any combination of red, green, blue and yellow phosphors.

An electronic flash in accordance with an embodiment of the invention includes a housing, a light source operatively coupled to the housing, the light source being configured to generate original light, and a wavelength-shifting region optically coupled to the light source to receive the original light. The wavelength-shifting region includes a fluorescent material having a wavelength-converting property to convert at least some of the original light to converted light to produce an output light having a wavelength spectrum in the visible wavelength range and the infrared wavelength range.

An imaging device in accordance with an embodiment of the invention comprises an electronic flash that produces an output light and an image sensor that electronically captures an image of a scene of interest. The electronic flash comprises a housing, a light source operatively coupled to the housing, the light source being configured to generate original light, and a wavelength-shifting region optically coupled to the light source to receive the original light. The wavelength-shifting region includes a fluorescent material having a wavelength-converting property to convert at least some of the original light to converted light to produce the output light having a wavelength spectrum in the visible wavelength range and the infrared wavelength range. The image sensor is configured to be sensitive to at least ultraviolet light.

A method for producing a flash of light for photography in accordance with an embodiment of the invention comprises generating original light, receiving the original light, including converting at least some of the original light into converted light by fluorescence, and emitting the converted light as a component of the output light to produce the flash of light. The output light having a wavelength spectrum in the visible wavelength range and the infrared wavelength range.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 3 is a diagram of an LED with an emission spectrum in the visible wavelength range and the infrared (IR) wavelength range in accordance with an embodiment of the invention.

FIGS. 4A, 4B and 4C are diagrams of LEDs with alternative lamp configurations in accordance with an embodiment of the invention.

FIGS. 5A, 5B, 5C and 5D are diagrams of LEDs with a leadframe having a reflector cup in accordance with an alternative embodiment of the invention.

DETAILED DESCRIPTION

Figure 1:
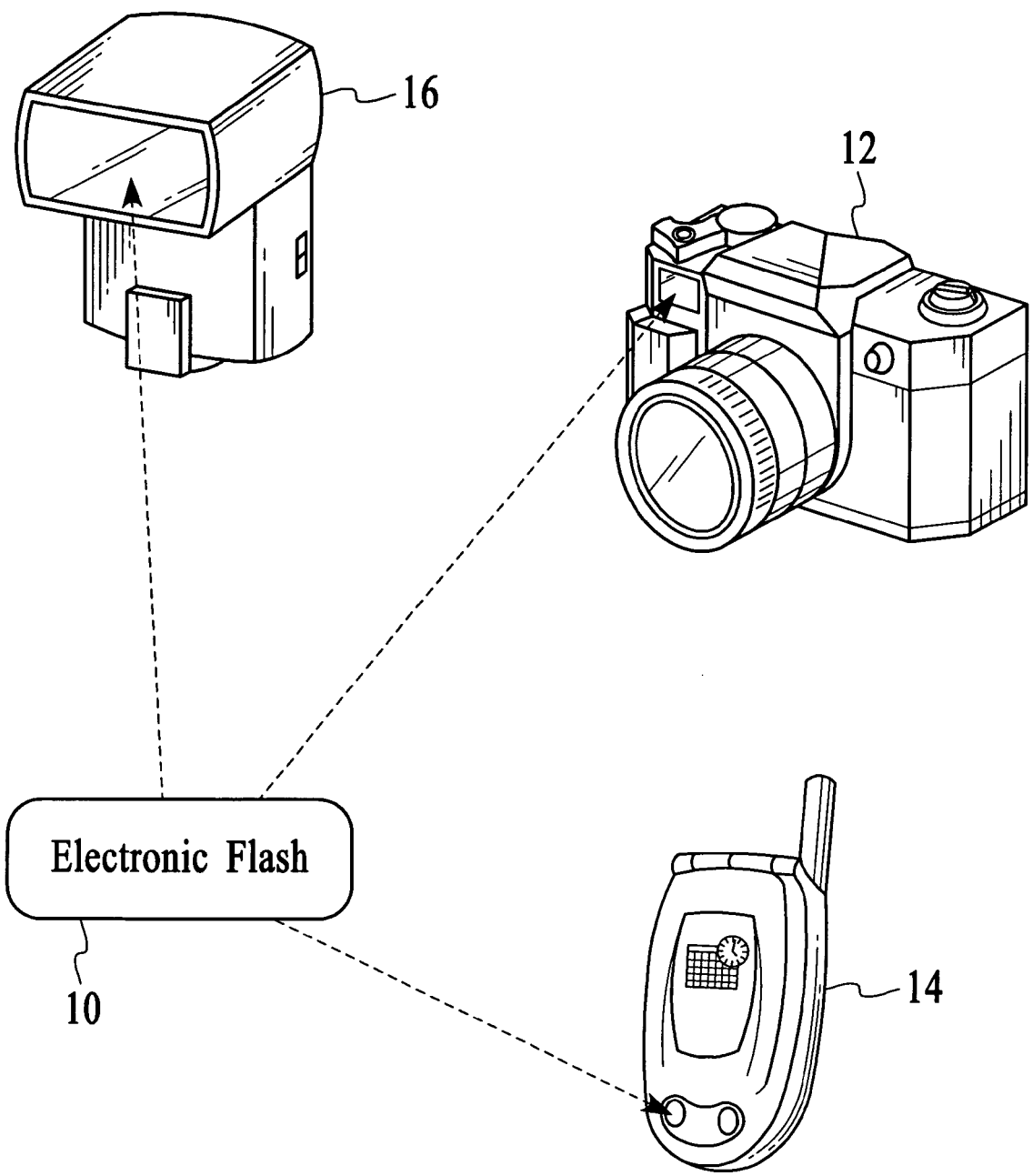
FIG. 1 shows an electronic flash in accordance with an embodiment of the invention, which may be included in an imaging device or an external flash unit.

With reference to FIG. 1, an electronic flash 10 for use in photography in accordance with an embodiment of the invention is described. The electronic flash 10 utilizes at least one light source device that produces an output light having a broad wavelength spectrum in both the visible wavelength range and the infrared (IR) wavelength range. Thus, the electronic flash 10 is capable of providing a flash of light having desired wavelength characteristics in which at least one component of the flash of light has a broad UV/visible wavelength spectrum.

As shown in FIG. 1, the electronic flash 10 may be included in a digital camera 12, a camera phone 14 or any other imaging device, which is sensitive to both visible and IR light. The electronic flash 10 may also be included in an external flash unit 16 that can be used in connection with an imaging device.

The external flash unit 16 may be designed to be attached an imaging device or to be used as an external device in connection with an imaging device. The electronic flash 10 is described in more detail below with reference to FIG. 2.

Figure 2:
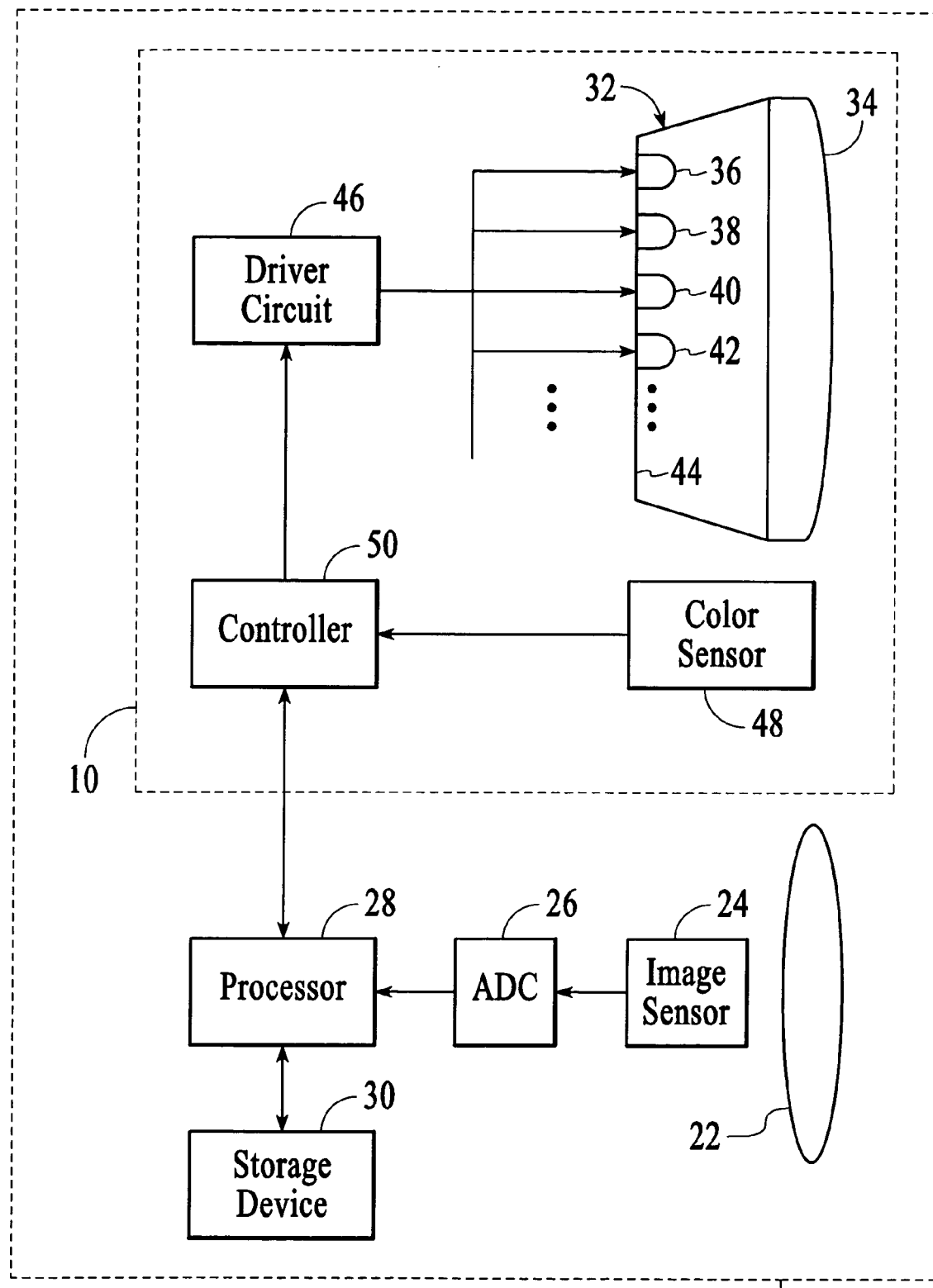
FIG. 2 is a diagram of a digital imaging device with an integrated electronic flash in accordance an embodiment of the invention.

In FIG. 2, a digital imaging device 20 with the electronic flash 10 in accordance an embodiment of the invention is shown. In this embodiment, the electronic flash 10 is incorporated into the digital imaging device 20. The digital imaging device 20 is described herein as a digital camera that is sensitive to both visible and IR light. However, the imaging device 20 can be any imaging device that is sensitive to both visible and IR light, such as a digital video camera.

As shown in FIG. 2, the imaging device 20 includes a lens 22, an image sensor 24, an analog-to-digital converter (ADC) 26, a processor 28, a storage device 30 and the electronic flash 10. The lens 22 is used to focus a scene of interest onto the image sensor 24 to capture an image of that scene. The image sensor 24 electronically captures the focused image by generating an electrical charge at each pixel of the image sensor in response to received light at that pixel. The image sensor 24 is sensitive to both visible and IR light so that IR light generated by the electronic flash 10 can be captured by the image sensor when the IR light is reflected off objects in a scene of interest. As an example, the image sensor 24 may be a Charged Coupled Device (CCD) or a metal-oxide semiconductor (MOS) image sensor. The electrical charges generated by the image sensor 24 are converted to digital signals by the ADC 26 for signal processing.

The processor 28 of the imaging device 20 processes the digital signals from the ADC 26 to produce a digital image of the captured scene of interest. The processes performed by the processor 28 may include demosaicing, image enhancements and compression. The resulting digital image is stored in the storage device 30, which may include a removable memory card.

The electronic flash 10 includes a housing 32, an optically transparent cover 34, and one or more light source devices 36, 38, 40 and 42. The housing 32 provides structural support for the light source devices 36, 38, 40 and 42. The housing 32 may include a reflective surface 44 to reflect some of the light generated by the light source devices 36, 38, 40 and 42 toward the optically transparent cover 34 so that most of the light generated by the light source devices can be transmitted through the cover as useful flash of light. The optically transparent cover 34 may be shaped as a lens to direct the light from the light source devices 36, 38, 40 and 42 to optimize the output light of the electronic flash 10.

The light source devices 36, 38, 40 and 42 of the electronic flash 10 are mounted on the reflective surface 44 of the housing 32. Each of the light source devices 36, 38, 40 and 42 of the electronic flash 10 can be any type of device that generates light, such as a light emitting diode (LED) or a laser diode. However, the light source devices 36, 38, 40 and 42 are described herein as being LEDs. In the illustrated embodiment, the electronic flash 10 includes one LED 36 that generates light having a wavelength spectrum in both the visible range and the IR range, which is referred to herein as the "visible/UV LED", and three other LEDs 38, 40 and 42. The type of other LEDs 38, 40 and 42 included in the electronic flash 10 depend on the different wavelength characteristics desired for the output light of the electronic flash. As an example, the other LEDs 38, 40 and 42 may include deep ultraviolet (UV), UV, blue, green, red and IR LEDs. The other LEDs 38, 40 and 42 may also include fluorescent LEDs that generate various color lights, including multi-colored lights such as white light, using fluorescence to convert at least some of the original light generated by a particular LED to longer wavelength light.

The LEDs 36, 38, 40 and 42 of the electronic flash 10 may be selectively activated and controlled to adjust the wavelength characteristics of the flash of light produce by the electronic flash 10. Thus, the electronic flash 10 may be configured to produce different wavelength emissions, which can be controlled to produce a flash of light having desired wavelength characteristics. The electronic flash 10 may produce IR emission using one or more IR LEDs and/or one or more phosphor-converted IR LEDs, such as the visible/UV LED. The electronic flash 10 may produce green emission using one or more green LEDs and/or one or more phosphor-converted green LEDs (with UV/blue or blue LED dies). The electronic flash 10 may produce blue emission using one or more blue LEDs and/or one or more phosphor-converted blue LEDs (with UV LED dies). The electronic flash 10 may produce red emission using one or more red LEDs and/or one or more phosphor-converted red LEDs (with UV/blue or blue LED dies). The electronic flash may produce white emission using a combination of different color LEDs and/or one or more phosphor-converted white LEDs (with UV/blue, green or blue LED dies).

As shown in FIG. 2, the electronic flash 10 further includes a driver circuit 46, an optional color sensor 48 and an optional controller 50. The driver circuit 46 is electrically connected to the light source devices 36, 38, 40 and 42 of the electronic flash 10. The driver circuit 46 provides driving signals to the light source devices 36, 38, 40 and 42 to selectively activate the light source devices to produce a flash of light, which may be a composite light produced from light generated by different light source devices. Depending on the desired wavelength characteristics of the flash of light, the strength of some of the driving signals can be varied to produce the desired light. The color sensor 48 is positioned in close proximity to the optically transparent cover 34 of the electronic flash 10 to receive the flash of light emitted from the cover. The color sensor 48 measures the wavelength characteristics of the light generated by the light source devices 36, 38, 40 and 42 of the electronic flash 10. These measurements are used by the controller 50 to monitor the wavelength characteristics of the light produced by the light source devices 36, 38, 40 and 42 and to adjust the wavelength characteristics of the light to produce a desired flash of light, which may be selected by the user. The controller 50 is able to adjust the wavelength characteristics of the flash of light by controlling the light source devices 36, 38, 40 and 42 via the driver circuit 46.

Turning now to FIG. 3, a visible/UV light source device in the form of an LED 100, which may be included in the electronic flash 10, in accordance with an embodiment of the invention is shown. The LED 100 produces output light having a broad wavelength spectrum in both the visible wavelength range and the infrared (IR) wavelength range. Thus, the output light of the LED 100 includes both visible and IR light. The output light is produced using a fluorescent material to convert some of the original light generated by the LED 100 into different wavelength light. The converted light modifies the wavelength spectrum of the original light to produce the desired wavelength spectrum of the output light. Since the output light includes not only visible light but also IR light, the LED 100 can be used for IR applications other than in electronic flashes, such as for IR signal transmission, as well as for visual light applications, such as for visual communication or visual effect.

As shown in FIG. 3, the LED 100 is a leadframe-mounted LED. The LED 100 includes an LED die 102, leadframes 104 and 106, a wire 108 and a lamp 110. The LED die 102 is a semiconductor chip that generates light of a particular peak wavelength. Thus, the LED die 102 is a light source for the LED 100. Although the LED 100 is shown to include a single LED die, the LED may include more than one LED die, e.g., one ultraviolet (UV) LED die and one visible LED die. The light from the LED die 102 generally has a narrow wavelength spectrum (approximately +/−10 nm). The LED die 102 may be designed to generate light having a peak wavelength in the ultraviolet and visible wavelength range (~100-700 nm). As an example, the LED die 102 may be a GaN-based LED, such as an InGaN or AlGaN LED, that generates light having a peak wavelength in the UV, blue or green wavelength range. As another example, the LED die 102 may be an AlInGaP die that generates light having a peak wavelength in the red, orange or yellow wavelength range.

The LED die 102 is situated on the leadframe 104 and is electrically connected to the other leadframe 106 via the wire 108. The leadframes 104 and 106 provide the electrical power needed to drive the LED die 102. The LED die 102 is encapsulated in the lamp 110, which is a medium for the propagation of light from the LED die 102. The lamp 110 includes a main section 112 and an output section 114. In this embodiment, the output section 114 of the lamp 110 is dome-shaped to f unction as a lens. Thus, the light emitted from the LED 100 as output light is focused by the dome-shaped output section 114 of the lamp 110. However, in other embodiments, the output section 114 of the lamp 100 may be horizontally planar.

The lamp 110 of the LED 100 is made of a transparent substance, which can be any transparent material, such as clear epoxy, silicone, hybrid system (of epoxy and silicone) or glass, so that light from the LED die 102 can travel through the lamp and be emitted out of the output section 114 of the lamp. In this embodiment, the lamp 110 includes a wavelength-shifting region 116, which is also a medium for propagating light, made of a mixture of the transparent substance and a fluorescent material 118. The fluorescent material 118 in the wavelength-shifting region 116 is used to convert at least some of the original light emitted by the LED die 102 to lower energy (longer wavelength) light. The amount of original light converted by the fluorescent material 118 may be varied, depending on the desired output light of the LED 100. For example, if the LED die 102 is an UV LED die, then virtually all of the original light may be converted by the fluorescent material 118 since UV light is harmful to the eyes, and thus, UV light is not desired in the output light. The converted light and unabsorbed light, if any, are emitted from the light output section 114 of the lamp 110 as output light of the LED 100.

The fluorescent material 118 in the wavelength-shifting region 116 may be composed of one or more inorganic phosphors, one or more fluorescent organic dyes, one or more hybrid phosphors one or more nano-phosphors, or any combination of fluorescent organic dyes, inorganic phosphors, hybrid phosphors and nano-phosphors. A hybrid phosphor is defined herein as a phosphor made of any combination of inorganic phosphors and organic phosphors or dyes. Regardless of the composition, the fluorescent material 118 has a wavelength-converting property to convert some or virtually all of the original light from the LED die 102 such that the wavelength spectrum of the output light includes the visible wavelength range and the IR range. The wavelength spectrum of the output light from the LED 100 depends on both the wavelength-converting property of the fluorescent material 118 in the wavelength-shifting region 116, as well as the peak wavelength of the original light generated by the LED die 102. Thus, in order to produce output light having a desired wavelength spectrum, the fluorescent material 118 and the LED die 102 must both be taken into account.

The following are some examples of LED die and fluorescent material that can be used together to produce output light having a broad wavelength spectrum in the visible wavelength range and the IR wavelength range in accordance with the invention. As used herein, the visible wavelength range is approximately 400 nm to 700 nm, and the IR wavelength range is approximately 700 nm to 1,600 nm. In the following examples, the color associated with each LED die is the peak wavelength of the light generated by that LED die. Similarly, the color associated with each phosphor is the peak wavelength of the light converted by that phosphor. The first example is a blue LED die and a fluorescent material of red and yellow phosphors, red and green phosphors, or red, yellow and green phosphors. This combination produces output light having a wavelength spectrum in the 400-950 nm range. The second example is a red LED die and a fluorescent material of red phosphor. This combination produces output light having a wavelength spectrum in the 600-1500 nm range. The third example is a deep UV LED die and a fluorescent material of red, blue and yellow phosphors, red, blue and green phosphors, or red, blue, green and yellow phosphors. This combination produces output light having a wavelength spectrum in the 400-800 nm range. As an example, the yellow phosphor may be: YAG:Ce; TAG:Ce; or YAG:Ce, Pr; the red phosphor may be: $CaS:Eu^{2+}$, $Mn^{2+}$; $SrS:Eu^{2+}$; $(Zn,Cd)S:Ag$; $Mg_4GeO_{5.5}F:MN^{4+}$; $ZnSe:Cu$; or $ZnSeS:Cu,Cl$; and the green phosphor may be $ZnS:Cu^+$; $SrGa_2S_4:Eu^{2+}$; $YAG:Ce^{3+}$; or $BaSrGa_4S_7:Eu$; and the blue phosphor may be $BaMg_2Al_{16}O_{27}:Eu$. However, any fluorescent substance having the desired wavelength-converting property may be used instead of the above examples.

Although the wavelength-shifting region 116 of the lamp 110 is shown in FIG. 3 as being rectangular in shape, the wavelength-shifting region may be configured in other shapes, such as a hemisphere. Furthermore, in other embodiments, the wavelength-shifting region 116 may not be physically coupled to the LED die 102. In an embodiment, the wavelength-shifting region 116 may be positioned elsewhere within the lamp 110. In another embodiment, the wavelength-shifting region 116 be positioned in the optically transparent cover 34 of the electronic flash 10.

In FIGS. 4A, 4B and 4C, LEDs 200A, 200B and 200C with alternative lamp configurations in accordance with an embodiment of the invention are shown. The LED 200A of FIG. 4A includes a lamp 210A in which the entire lamp is a wavelength-shifting region. Thus, in this configuration, the entire lamp 210A is made of the mixture of the transparent substance and the fluorescent material 118. The LED 200B of FIG. 4B includes a lamp 210B in which a wavelength-shifting region 216B is located at the outer surface of the lamp. Thus, in this configuration, the region of the lamp 210B without the fluorescent material 118 is first formed over the LED die 102 and then the mixture of the transparent substance and the fluorescent material 118 is deposited over this region to form the wavelength-shifting region 216B of the lamp. The LED 200C of FIG. 4C includes a lamp 210C in which a wavelength-shifting region 216C is a thin layer of the mixture of the transparent substance and fluorescent material 118 coated over the LED die 102. Thus, in this configuration, the LED die 102 is first coated or covered with the mixture of the transparent substance and the fluorescent material 118 to form the wavelength-shifting region 216C and then the remaining part of the lamp 210C can be formed by depositing the transparent substance without the fluorescent material 118 over the wavelength-shifting region. As an example, the thickness of the wavelength-shifting region 216C of the LED 200C can be between ten (10) and sixty (60) microns.

In an alternative embodiment, the leadframe of a LED on which the LED die is positioned may include a reflector cup, as illustrated in FIGS. 5A, 5B, 5C and 5D. FIGS. 5A-5D show LEDs 300A, 300B, 300C and 300D with different lamp configurations that include a leadframe 320 having a reflector cup 322. The reflector cup 322 provides a depressed region for the LED die 102 to be positioned so that some of the light generated by the LED die is reflected away from the leadframe 320 to be emitted from the respective LED as useful output light.

The different lamp configurations described above can be applied other types of LEDs, such as surface-mounted LEDs, to produce other types of LEDs in accordance with the invention. In addition, these different lamp configurations may be applied to other types of light emitting devices, such as semiconductor lasing devices, in accordance with the invention. In these light emitting devices, the light source can be any light source other than an LED die, such as a laser diode.

Figure 6:
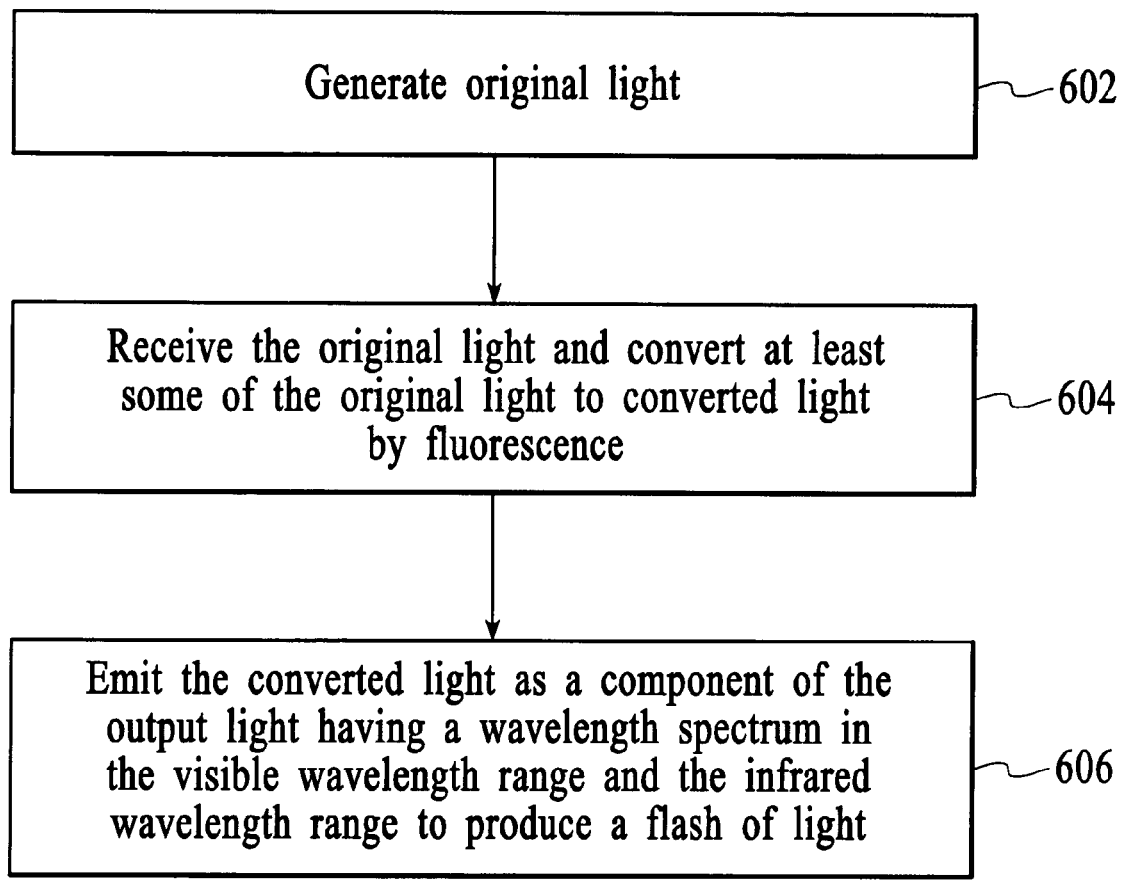
FIG. 6 is a flow diagram of a method for producing a flash of light in accordance with an embodiment of the invention.

A method for producing a flash of light for use in photography in accordance with an embodiment of the invention is described with reference to FIG. 6. At block 602, original light is generated. The original light may be generated from an LED die, such as a UV LED die, a blue LED die or a red LED die. Next, at block 604, the original light is received and at least some of the original light is converted to converted light by fluorescence. The converting of the original light may be achieved using one or more phosphors, such as red, blue, yellow and green phosphors. Next, at block 606, the converted light is emitted as a component of the output light to produce the flash of light. The output light has a wavelength spectrum in the visible wavelength range and the IR wavelength range.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An electronic flash for use in visible light and/or infrared (IR) applications, said electronic flash comprising:
    a light source configured to generate original light comprising at least a portion of the visible wavelength spectrum and at least a portion of the ultraviolet wavelength spectrum; and
    a wavelength-shifting region optically coupled to said light source to receive said original light, said wavelength-shifting region including a fluorescent material having a wavelength-converting property to convert at least some of said original light to output light encompassing a first wavelength range in the visible wavelength spectrum and a second wavelength range in the infrared wavelength spectrum.

2. The electronic flash of claim 1 wherein said light source includes a light emitting diode (LED) in which is housed a first LED die for emitting light in the at least a portion of the visible wavelength spectrum, and a second LED die for emitting light in the at least a portion of the ultraviolet wavelength spectrum.

3. The electronic flash of claim 2, wherein the first LED die is configured for emitting light in the at least a portion of the visible wavelength spectrum over a first period of time, and the second LED die is configured for emitting light in the at least a portion of the ultraviolet wavelength spectrum over a second period of time that is different than the first period of time.

4. The electronic flash of claim 2, wherein the first LED die is configured to emit light at a first amplitude, and the second LED die is configured to emit light at a second amplitude that is different than the first amplitude.

5. The electronic flash of claim 1, wherein a blue LED is configured to generate the at least a portion of the visible wavelength spectrum, an ultraviolet (UV) LED is configured to generate the at least a portion of the ultraviolet wavelength spectrum, and wherein the fluorescent material is selected to convert the original light emitted by the light source into output light ranging from about 400 nm in the visible wavelength spectrum to about 950 nm in the IR wavelength spectrum.

6. The electronic flash of claim 5, wherein the fluorescent material is a hybrid phosphor containing a red phosphor and at least one of a) a green phosphor and b) a yellow phosphor.

7. The electronic flash of claim 6, wherein the red phosphor comprises at least one of a) $CAS:Eu^{2+}$, b) $Mn^{2+}$, c) $SrS:Eu^{2+}$, d) $(Zn, Cd)S:Ag$, e) $Mg_4GeO_{5.5}F:MN^{4+}$, f) $ZnSe:Cu$, and g) $ZnSeS:Cu,Cl$.

8. The electronic flash of claim 6, wherein the green phosphor comprises at least one of a) $SrGa_2S_4:Eu^{2+}$, b) $YAG:Ce^{3+}$, and c) $BaSrGa_4S_7:Eu$.

9. The electronic flash of claim 6, wherein the yellow phosphor comprises at least one of a) YAG:Ce, b) TAG:Ce, and c) YAG:Ce, Pr.

10. The electronic flash of claim 1, wherein a red LED is configured to generate the at least a portion of the visible wavelength spectrum, an ultraviolet (UV) LED is configured to generate the at least a portion of the ultraviolet wavelength spectrum, and wherein the fluorescent material is selected to convert the original light emitted by the light source into output light ranging from about 600 nm in the visible wavelength spectrum to about 1500 nm in the IR wavelength spectrum.

11. The electronic flash of claim 10, wherein the fluorescent material is a red phosphor.

12. The electronic flash of claim 1, wherein a ultraviolet (UV) LED is configured to generate the at least a portion of the ultraviolet wavelength spectrum, and wherein the fluorescent material is selected to convert the original light emitted by the light source into output light ranging from about 400 nm in the visible wavelength spectrum to about 800 nm in the IR wavelength spectrum.

13. The electronic flash of claim 12, wherein the fluorescent material is a hybrid phosphor containing a red phosphor, a blue phosphor, and at least one of a) a green phosphor and b) a yellow phosphor.

14. The electronic flash of claim 13, wherein the blue phosphor comprises $BaMg_2Al_{16}O_{27}:Eu$.

15. The electronic flash of claim 1, wherein the light source is configured to generate the at least a portion of the visible wavelength spectrum substantially concuffent with the at least a portion of the ultraviolet wavelength spectrum, whereby the first wavelength range in the visible wavelength spectrum and the second wavelength range in the infrared wavelength spectrum are output substantially concuffently from the electronic flash.

16. A method for producing a flash of light containing visible light as well as infrared light, said method comprising:
    generating original light comprising at least a portion of the visible wavelength spectrum and at least a portion of the ultraviolet wavelength spectrum;

converting at least some of said original light into converted light by fluorescence; and emitting said converted light as a component of said flash of light, said flash of light having a wavelength range spanning at least a portion of the visible wavelength spectrum and at least a portion of the infrared wavelength spectrum.

17. The method of claim 16 wherein converting said original light by fluorescence comprises wavelength shifting the at least a portion of the ultraviolet wavelength spectrum to a wavelength in the infrared spectrum.

18. The method of claim 17 wherein said converting comprises using at least one of a fluorescent organic dye, an inorganic phosphor, a hybrid phosphor or a nano-phosphor.

19. A light emitting diode (LED) for dual-purpose use in visible light and/or infrared (IR) applications, the LED comprising:

a first light emitting die for emitting light in at least a portion of the visible wavelength spectrum; and a second light emitting die for emitting light in at least a portion of the ultraviolet wavelength spectrum; the first and second light emitting dies configured for simultaneously emitting a combination light that encompasses at least a portion of the visible wavelength spectrum and a portion of the ultraviolet wavelength spectrum.

20. The LED of claim 19, further comprising a fluorescent material having a wavelength-converting property to convert the combination light emitted by the first and second light emitting dies to output light encompassing a first wavelength range in the visible wavelength spectrum and a second wavelength range in the infrared wavelength-spectrum.

21. The LED of claim 20, further comprising a leadframe on which at least one of the first and the second light emitting dies is mounted.

22. The LED of claim 21, wherein the leadframe comprises a depressed region for mounting the at least one of the first and the second light emitting dies.

23. The LED of claim 22, wherein the depressed region is configured as a reflector cup.

\* \* \* \* \*